United States Patent [19]
Dux et al.

[11] Patent Number: 5,655,922
[45] Date of Patent: Aug. 12, 1997

[54] MODULAR CONTROL SYSTEM

[75] Inventors: Dietmar Dux; Walter Hanning, both of Detmold; Uwe Fiene, Steinheim; Michael Schnatwinkel, Herford; Rudolf Steinmeier; Manfred Wilmes, both of Detmold; Christian Hamann, Holzminden; Thomas Hettwer, Detmold; Christoph Zebermann, Beverungen; Hans-Georg Glathe, Detmold, all of Germany

[73] Assignee: Weidmuller Interface GmbH, Detmold, Germany

[21] Appl. No.: 550,688

[22] Filed: Oct. 31, 1995

[30]  Foreign Application Priority Data

Oct. 31, 1994 [DE] Germany ............ 44 38 801.2

[51] Int. Cl.⁶ ..................................... H01R 4/60
[52] U.S. Cl. .............................. 439/213; 439/717
[58] Field of Search ........................ 439/213, 210, 439/115, 717

[56]  References Cited

U.S. PATENT DOCUMENTS 4,981,449  1/1991  Buchter ................... 439/213
5,122,072  6/1992  Am et al. ................. 439/213
5,306,165  4/1994  Nadeau .................... 439/115

FOREIGN PATENT DOCUMENTS 2247836  10/1973  France.
3616662  11/1987  Germany .................. 439/210
4140611   5/1993  Germany.
4303717   8/1994  Germany.

*Primary Examiner*—Gary F. Paumen
*Attorney, Agent, or Firm*—Laubscher & Laubscher

[57]  ABSTRACT

In this modular control assembly, individual bus conductor segments are integrated in modular, alignable housing blocks. The bus conductor segments have strip conductors on the upper and lower surfaces thereof. The bus conductor segments of mutually adjoining housing blocks are electrically connected by separating slide contact members. The contact members comprise a closed housing containing upper and lower contact springs for engaging the strip conductors of the bus conductor segment. The slide contact members can be pushed between an extended position in which they grasp the mutually facing ends of bus conductor segments (8) of neighboring housing blocks and a retracted position in which only one bus conductor segment is covered by the slide contact member.

13 Claims, 4 Drawing Sheets

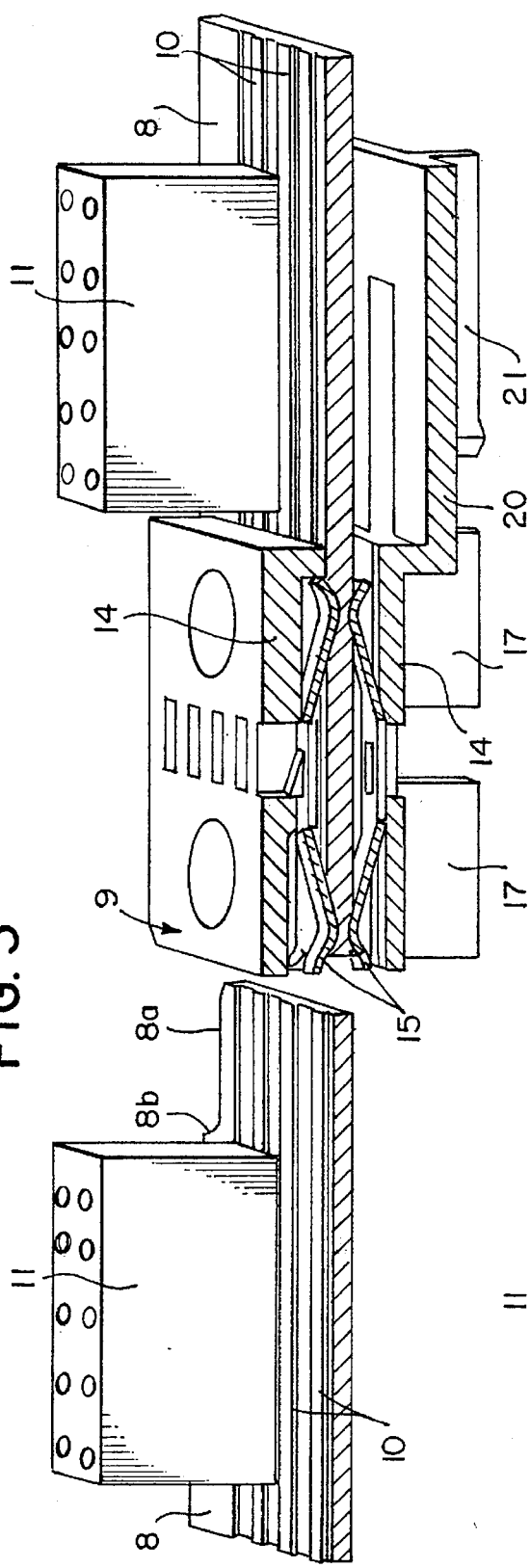
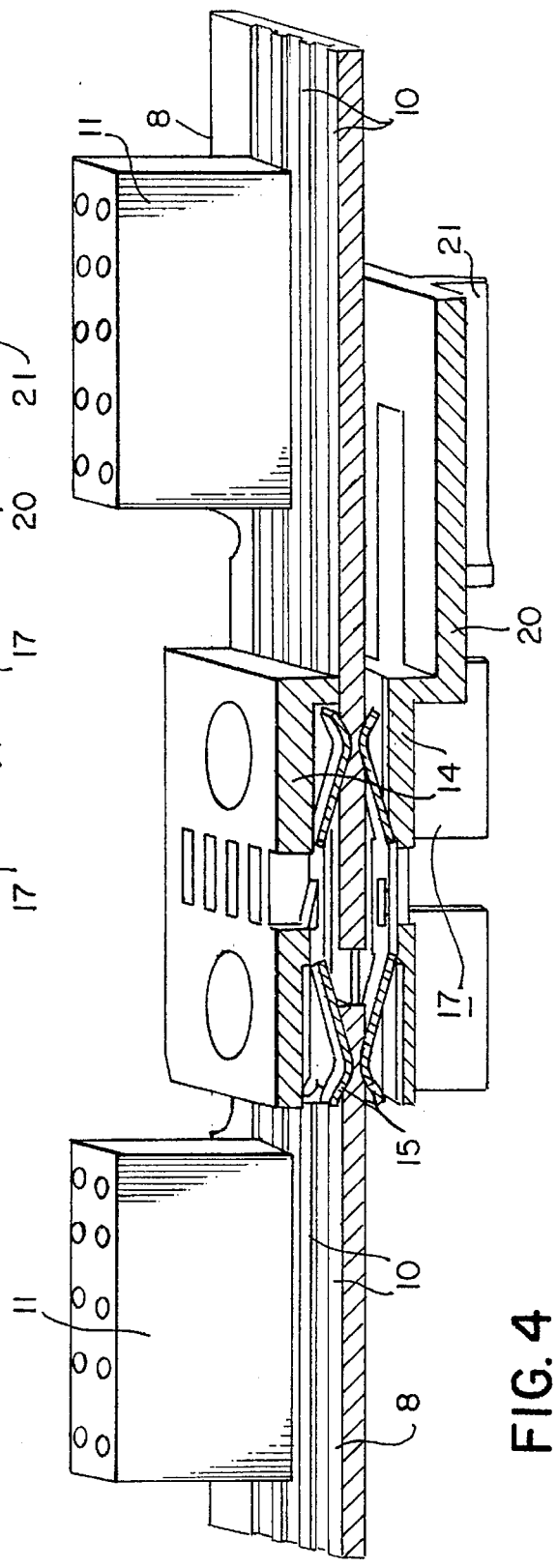

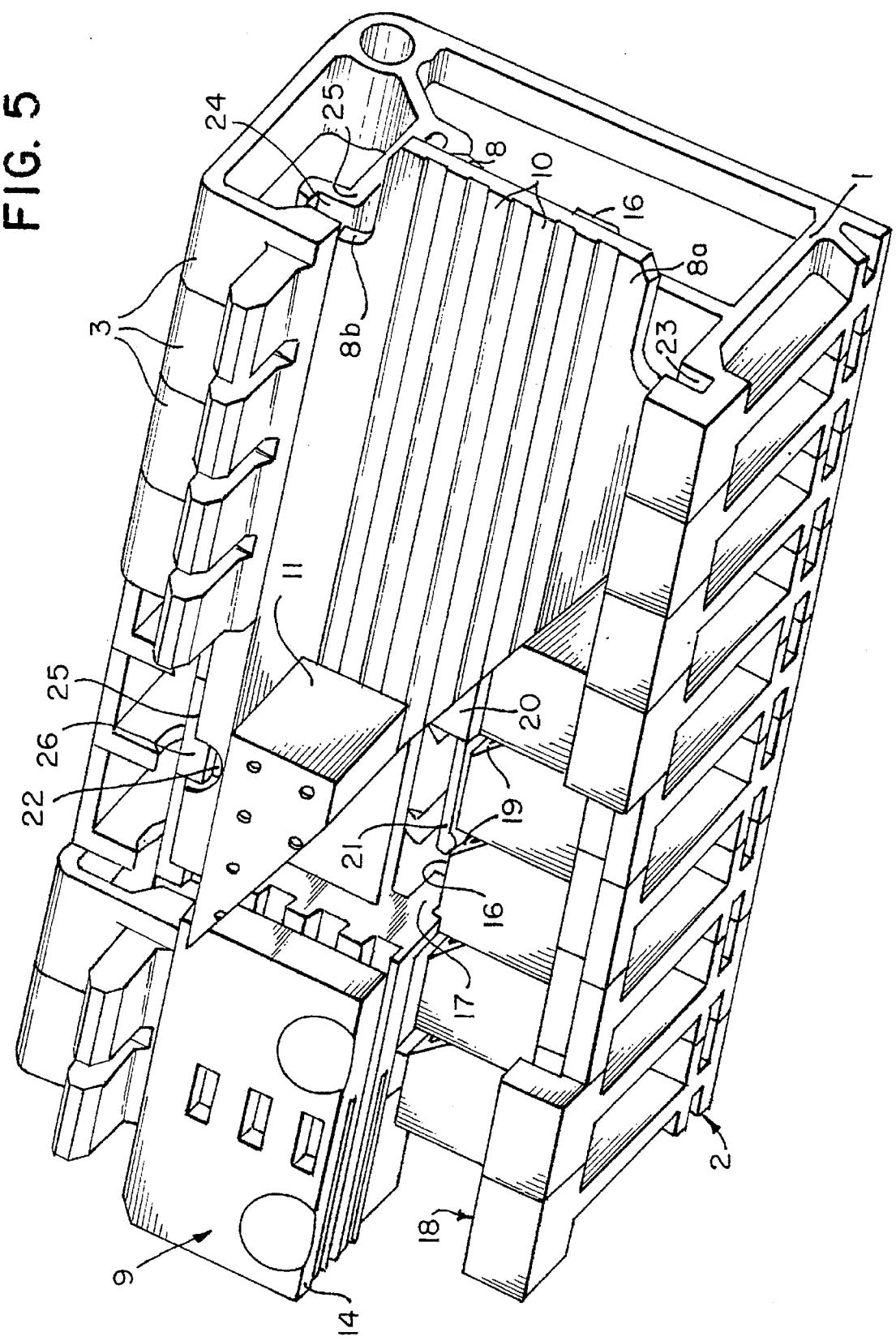

MODULAR CONTROL SYSTEM

BACKGROUND OF THE INVENTION

The present invention relates to a modular control assembly, especially for electronic control and automation systems with housing blocks that can be lined up next to each other. Bus conductor segments of an internal bus conductor are arranged with movable contact members for the electrical connection of the bus conductor segments of neighboring housing blocks and with electronics modules that can be mechanically connected with the housing blocks via a plug connection and that can also be connected to the bus conductor segments via a plug connection in an electrically conducting fashion.

BRIEF DESCRIPTION OF THE PRIOR ART

In a known control system disclosed in German patent No. DE 41 40 611C1, the individual electronics modules can be taken out of the lineup without the entire internal bus conductor being interrupted because the housing block of the concerned electronics module can remain in the lineup and the contact members maintain the conducting connection of the concerned bus conductor segments of neighboring housing blocks. The control system can also be supplemented and expanded with these structural member groups. In the known control system, the contacting member is a three-point contact that is made roughly angular and in which, on its open underside, there are provided adjacent contact springs corresponding to the number of strip conductors in the topside of the bus conductor segments. The upward-pointing angle of the three-point contact contains the plug connections for contacting the functional printed circuit board in the electronics module. In this device, the number of possible strip conductors to be inserted into the internal bus conductor is limited, or a large number of strip conductors leads to a considerable structural width.

If, furthermore, a housing block is also to be taken out of the lineup, then next to the concerned electronics module, at least one adjoining electronics module must be taken out in order to be able to shift the two concerned contact members so that the housing block can be taken out of the lineup. The assembly of these contact members during the erection, expansion or conversion of such a control system is not easy to handle because these contact members—in order to generate the contact spring pressure—must be forced into narrow guides of adjoining housing parts and because these are loose individuals structural members that must be stored and transported individually and thus are easily lost.

Also know in the art are modular control systems that can be put together with pluggable electronics modules and connection modules where the connection modules have supply conductor connections and signal conductor connections and are made up of individual connection discs as disclosed in German patent No. DE 43 03 717 A1. By virtue of the corresponding configuration of the individual connection discs, the modular connection blocks also form a reception zone for an internal bus conductor.

French patent No. 2,247,836 discloses a connector for busbars of a carrier and current distribution system that comprises contact sheets and wire-like auxiliary contacts that are arranged in an insulated fashion above each other in a housing and that protrude laterally. The auxiliary contacts are pushed into two busbar segments that are to be connected. A busbar segment connected bilaterally in this fashion can be removed between fixed neighboring bar segments since the connectors are fully pushed into a busbar segment. Reliable contact requires a precise coordinated dimensioning of the connectors and the cooperating busbar sectors.

SUMMARY OF INVENTION

Accordingly, it is a primary object of the present invention to provide a modular control assembly that will make it possible to use a large number of strip connectors of the internal bus conductor in a space-saving manner and whose assembly, conversion and/or expansion will be particularly simple and easy to handle as regards the contact members used to connect the internal bus conductor segments of neighboring housing blocks in their lineup. More particularly, the contact members are self-supporting, compact separating slides with upper and lower contact springs for strip conductors on the upper and lower surfaces of bus conductor segments. The contact members can be shifted between an extended contact position that grasps the mutually facing ends of the bus conductor segments of neighboring housing blocks and a retracted separating position that covers only one bus conductor segment.

With the invention, a plurality of strip conductors of the internal bus conductor can be arranged in a narrow space and can be connected to the bus conductor segments of neighboring aligned housing blocks via such a separating slide contact member because the bus conductor segments can be used on the upper and lower surfaces of the conductor segment. The slide contact member facilitates the insertion of upper and lower contact springs whose contact spring force is generated by corresponding walls of the housing of the contact member so that the member will retain itself on the bus conductor segments and also guide itself, so that no additional guides in the housing blocks are required. The assembly and shifting of such separating slide contact members are extraordinarily simple and easy to handle because spring contact force need not materialize due to special supports of the contact member upon adjoining sectors of the housing block. Owing to this design, the separating contact members can be integrated with a housing block in production terms so that individual assembly elements are not required. This simplifies stockpiling and transportation and contributes to a higher degree of ease of handling at the user's end.

According to another object of the invention, a locking mechanism is provided for retaining the contact member in its retracted and extended positions. This provides the advantage that for transportation and storing, the contact members can be secured in the retracted position. For connection with adjacent bus conductor segments, the contact member is locked in the extended position for protection with respect to vibration stresses as well as against gravity in case of correspondingly oblique or perpendicular arrangement positions in the control assembly. The bus conductor segments in their assembly position are also locked in the corresponding housing blocks so that in case of vibration stress and when exposed to the force of gravity, they cannot be shifted in case of a corresponding arrangement of the control assembly as well as upon operation of the slide contact member.

The housing blocks preferably form a sector of aligned modular connecting blocks that have supply conductor connections and signal conductor connections and that are put together from individual connection discs. Apart from the fact that a control assembly thus constructed is extremely flexible in terms of design, the locking mechanisms for the slide contact members and the bus conductor segments can be constructed in a simple and variable fashion because the receiving configuration on the housing side for the bus conductor segments and the contact members are formed with the corresponding configuration of the individual connection discs of the block.

BRIEF DESCRIPTION OF THE FIGURES

Other objects and advantages of the invention will become apparent from a study of the following specification when viewed in the light of the accompanying drawing, in which:

FIGS. 3 and 4 are partial cut-away views of a slide contact member in its retracted position that covers only one bus conductor segment and in its extended position that grasps the facing, neighboring ends of two bus conductor segments, respectively; and FIG. 5 is a partially cut-away prespective view of the housing block sector of a connection block formed of individual discs with an inserted bus conductor segment having a slide contact member arranged thereon.

DETAILED DESCRIPTION

Figure 1:
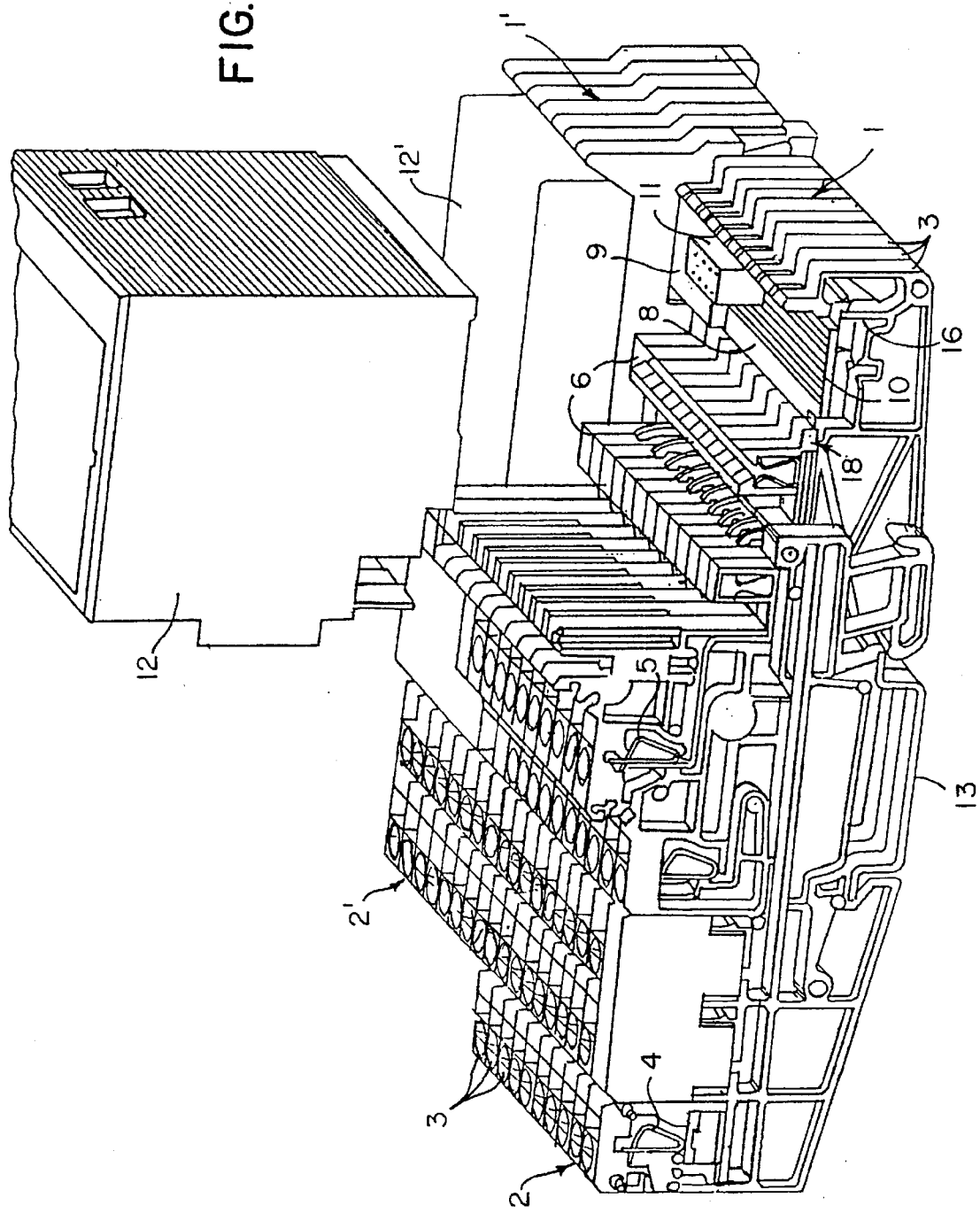
FIG. 1 is a perspective view of a part of a modular control assembly according to the invention.

The basic structure of the modular control assembly according to the invention is shown in FIG. 1. The assembly is primarily for electronic control and automation systems and includes housing blocks 1 that in this particular exemplary embodiment are sectors of connecting blocks 2 which, including the housing sector, are formed of individual connection discs 3 to form blocks with the particular desired size. In the connection disc 3, there are supply conductor connections 4—including protection/screen conductor connections for the connection of initiators, sensors, field instruments and the like—as well as signal conductor connections 5 that have electrically conducting connections for plug connections 6.

In the area of the housing block 1, which is likewise formed by the aligned connection discs of the connecting blocks 2, there is arranged a bus conductor 8. The bus conductor segments 8 of neighboring, aligned connection blocks 2 can be connected to each other in an electrically conducting fashion via separating slide contact members 9 that will be described in detail below. Bus conductor segments 8 thus form an internal bus conductor of a control assembly.

On the bus conductor segments 8 are plug connectors 11 linked in an electrically conducting fashion with strip conductors 10 of the bus conductor segments 8. Electronics modules 12 can be plug-connected by means of this arrangement as additional elements of such modular control systems. Specifically, their functional printed circuit blocks—arranged inside the module housing—are connected in an electronically conducting fashion with the plug connections 6 of connection blocks 2 and the plug connectors 11 and their housings in a mechanically locking fashion with corresponding opposite housing sectors of connection blocks 2. At one end of such a modular control assembly, there is preferably a connection block 2' with a corresponding housing block 1' with which an electronics module 12' can be plug connected for the purpose of coupling the internal bus conductor constructed with bus conductor segments 8 to an external field bus. To provide the electrical connection or separation of bus conductor segments 8 of connection block 2 that adjoins the housing block 1' with respect to a corresponding bus conductor segment in the housing block 1' for electronics module 12', a slide contact member 9 is used.

Deviating from the preferred embodiment described and shown, such electronics modules 12, 12' can also be mounted on housing blocks that can be aligned and that are made in one piece and in which bus conductor segments 8 are arranged to form an internal bus conductor of the modular control assembly. Aligned connection blocks 2 or the above-mentioned integral housing blocks that can be aligned are customarily mounted on carrying rails 13 next to each other.

Figure 2:
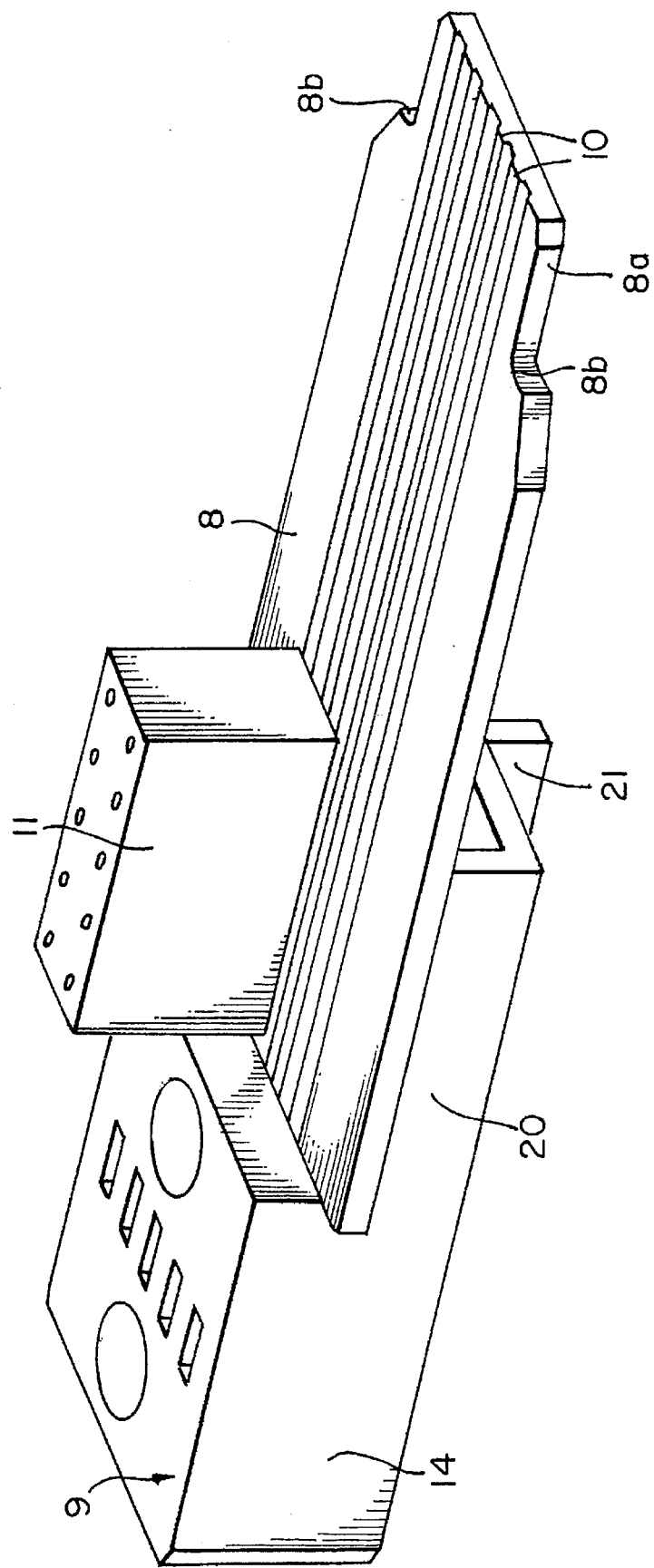
FIG. 2 is a perspective view of a bus conductor segment of a housing block of the control assembly according to FIG. 1 with a contact member arranged thereon.

As shown in greater detail in FIGS. 2–4, the bus conductor segments 8 are provided on the upper and lower surfaces with strip conductors 10 so that many strip conductors can be used in a space-saving manner. Slide contact members 9 for the electrical connection or electrical separation of mutually facing ends of bus conductor segments 8 in the assembly of adjoining housing blocks 1 of connection blocks 2 or housing blocks 1' are self-supporting and have a compact configuration in the form of a housing 14 having slots or recesses at either end that can be penetrated by narrowed terminal segments 8a of the bus conductor segments 8. Within the contact member housing are arranged upper and lower contact springs 15 for engaging the upper and lower strip conductors 10 on the bus conductor segments. The number of upper and lower contact springs 15 corresponds to the number of upper and lower strip conductors 10 of the bus conductor segments 8. The arrangement of contact springs 15 within the housing 14 means that the housing generates the contact spring force due to the support of the contact springs 15 on segments of the housing 14. As a result, the contact members 9 are arranged in a reciprocal manner in a self-sustaining fashion upon the bus conductor segments 8a.

The slide contact members 9 are also guided in a movable fashion in adjoining sectors of housing blocks 1, 1'. The connection discs 3 of connecting blocks 2 are so contoured that when aligned inside the block, they define a guide groove 16 located underneath the receiving point for the bus conductor segments 8. The contact members 9 have guide members 17 on the underside of the housing 14, the guide members 17 being guided in guide grooves 16. Also possible is guidance of the lateral walls of housing 14 upon the adjoining wall segments 18 of the sector of housing block 1 of connecting blocks 2.

During the assembly or expansion of a modular control assembly of the invention for the purpose of forming the internal bus conductor of the control system, the bus conductor segments 8 of aligned neighboring connection blocks 2 or housing block 1, 1' are electrically connected by slide contact members 9 that are shifted into the advance contact position shown in FIG. 4 in which they protrude beyond their particular association housing block 1 into the housing block 1, 1' of the adjoining connection block 2, 2'. The adjoining block has a corresponding entry opening in which the contact member can contact the strip conductors 10 of the bus segment 8 in the adjoining block with the corresponding ends of their upper and lower contact springs 15.

Electronics modules 12, 12' are so contoured on the underside that one electronics module 12 can be disconnected from the concerned connection block 2, whereby the electrical contact of the internal bus conductor segment 8 of this connection block is maintained via the two contact members 9 that cooperate with it. If during conversion or exchange, a connection block 2 is to be removed in its entirety, then electronics module 2 is first disconnected. The contact member 9 that is associated with this connection block 2 is pushed back into the retracted position shown in FIG. 2. The contact member then covers only the end segment 8a of this bus conductor segment 8 of this block and is then completely released from the adjoining block. The other contact member 9 is completely displaced into the adjoining block by the concerned bus conductor segment 8 of the block that is to be removed so that this contact member will then also be in the retracted position. The concerned connection block 2 can then be removed by unlocking it from carrying rail 13.

The contact members 9 can be locked in either of the extended or retracted positions. The extended position is thus secured with respect to any shaking stresses or gravity stresses if the contact member 9 has a correspondingly oblique or perpendicular position in terms of space. The retracted position is then secured during transport and storage and, as a result, a contact member 9 can already be matched up with a modular block at the manufacturer by means of arrangement on the integrated bus conductor segment 8.

Referring to FIG. 5, locking of the contact member is achieved via a locking mechanism comprising a catch release 19 on one side of the connection discs 3 adjacent to guide groove 16. The contact members 9 include a lower rear projection 20 having a catch spring 21 depending therefrom as shown in FIGS. 3 and 4. The catch spring 21 is aligned with the guide members 17 depending from the housing 14 of the contact member. The catch spring 21 includes a catch portion for engaging one of the catch releases 19 of the connection discs 3.

The bus conductor segment 8 has a tapered end portion 8a which fits within a recess of a contact member of an adjoining bus conductor segment when the adjoining contact member is extended to a connecting position. At the transition of the tapered end portion 8a, the bus conductor segment has shoulder 8b which acts as a stop for the adjoining contact member in its extended position.

Guide member 17, in conjunction with catch spring 21, provide a high degree of protection against jamming with regard to the sliding motion of contact members 9. This is also helped along by the extension of the side walls of the contact member housing 14 by the lower rear projection 20 whose width corresponds to the width of housing 14 so that there is still a guidance function along the wall segments 18 of the sector of housing block 1 of connection blocks 2. The catch spring 21 of the contact member 9 in a practical manner comprises a segment comparable to guide members 17 and a narrower and freely movable spring segment that is connected therewith and that carries the catch portion.

In the embodiment of FIG. 5, the bus conductor segments 8 at a predetermined location have a lateral catch release 22. Connection discs 3 of connecting blocks 2 are so contoured in the sector of the housing block 1 that bilaterally in the receiving slot, they form plug grooves and receiving grooves 23, 24 into which one can insert the bus conductor segments 8 with their lateral marginal sectors. The plug and receiving groove 24 is in this case limited underneath and laterally by spring elements 25 that are molded in an upward protruding fashion upon the housing of connection discs 3, whereby in the lateral limitation of the spring elements 25 in each connection disc 3, there is provided a small, protruding catch portion 26.

The bus conductor segment 8 is so dimensioned that by way of a slightly elastic deflection of spring elements 25 enables the segment to lie in plug and receiving grooves 23, 24. In the desired position, one of the catch portions 26 of the aligned spring elements 25 can then engage the catch release 22 of the bus conductor segment 8 as shown in FIG. 5.

Deviating from the exemplary embodiment described above, electronics modules can also be constructed with one disc and can be mounted on individual connection discs 3 that are aligned to form housing blocks, in which case the plug connector 11 is then also constructed in the disc grid and connects the functional printed circuit board with a through-going bus printed circuit board 8.

While in accordance with the provisions of the Patent Statute the preferred forms and embodiments of the invention have been illustrated and described, it will be apparent to those skilled in the art that various changes and modifications may be without deviating from the inventive concepts set forth above.

What is claimed is:

1. A modular electronic control assembly, comprising
   (a) a plurality of aligned housing blocks (1) each containing a segment (8) of an internal bus conductor, said segment containing a plurality of strip conductors (10) on upper and lower surfaces thereof;
   (b) means for electrically connecting said bus conductor segments of adjacent housing blocks, said connecting means comprising;
      (1) a compact contact member (9) slidably mounted on one end of said segment for reciprocal movement between retracted and extended positions; and
      (2) upper and lower contact springs (15) connected with said contact member, said upper and lower contact springs engaging said upper and lower strip conductors on said segment, respectively, said contact member when in said retracted position engaging said segment conductors, said contact member when in said extended position engaging said segment conductors and strip conductors of an adjacent bus conductor segment, thereby to electrically connect said conductors of said bus conductor segments of adjacent housing blocks.

2. An assembly as defined in claim 1, and further comprising means for retaining said contact member in one of its retracted and extended positions.

3. An assembly as defined in claim 2, wherein said contact member comprises a housing (14) having a pair of slots at opposite ends thereof for receiving the ends of the adjacent bus conductor segments, respectively, said contact springs being arranged within and extending continuously between said housing slots.

4. An assembly as defined in claim 3, wherein said plurality of housing blocks define at least a portion of modular, alignable connecting blocks (2) comprising a plurality of connection discs (3), said connecting blocks including supply conductor connections (4) and signal conductor connections (5).

5. An assembly as defined in claim 4, wherein said connection discs include wall segments (18) which are aligned to define a guide wall for said contact member housing.

6. An assembly as defined in claim 5, wherein said connection discs contain guide groove segments which are aligned to define a guide groove (16) and further wherein said contact member housing includes a guide member (17) projecting from a lower surface thereof for engaging said guide groove.

7. An assembly as defined in claim 6, wherein said locking means comprises a flexible catch spring (21) connected with said contact member, said connection discs each including a catch release (19) for said flexible catch spring.

8. An assembly as defined in claim 7, wherein said flexible catch spring is arranged on an underside of a rear projection (20) of said contact member housing, said projection being aligned with said housing guide member.

9. An assembly as defined in claim 7, wherein said flexible catch spring comprises a further guide member.

10. An assembly as defined in claim 8, wherein said rear projection has a lateral dimension corresponding with a lateral dimension of said housing, said rear projection comprising a further guide member.

11. An assembly as defined in claim 4, wherein each housing block contains at least one slot for receiving said bus conductor segment, said slot being defined by laterally opposed plug and receiving grooves (23,24) formed by aligned plug and groove segments of said connecting block connection discs.

12. An assembly as defined in claim 11, wherein one of said plug and receiving grooves is partially defined by spring elements (25) formed on said connection discs, each of said spring elements including a catch portion (26) adjacent said groove, said bus conductor segment including a segment catch release (22) which cooperates with said spring element catch portion.

13. An assembly as defined in claim 1, wherein said bus conductor segment includes a narrowed end (8a) defining a shoulder (8b) which serves as a stop for a contact member from an adjacent bus conductor segment in said extended position.

* * * * *

UNITED STATES PATENT AND TRADEMARK OFFICE
CERTIFICATE OF CORRECTION

PATENT NO. : 5,655,922

DATED : August 12, 1997

INVENTOR(S) : Dietmar Dux, et al.

It is certified that error appears in the above-identified patent and that said Letters Patent is hereby corrected as shown below:

On the title page, item [73] Assignee should read:

-- Weidmüller Interface GmbH & Co. --

Signed and Sealed this

Sixth Day of April, 1999

Attest:

Q. TODD DICKINSON

*Attesting Officer*

*Acting Commissioner of Patents and Trademarks*